US008670739B1

(12) United States Patent
Murphy et al.

(10) Patent No.: US 8,670,739 B1
(45) Date of Patent: Mar. 11, 2014

(54) FREQUENCY-TRANSLATIONAL BANDPASS FILTER WITH HARMONIC REJECTION

(71) Applicant: Broadcom Corporation, Irvine, CA (US)

(72) Inventors: David Murphy, Costa Mesa, CA (US); Hooman Darabi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/736,915

(22) Filed: Jan. 8, 2013

Related U.S. Application Data

(60) Provisional application No. 61/737,078, filed on Dec. 13, 2012.

(51) Int. Cl.
*H04B 1/10* (2006.01)
*H04B 17/00* (2006.01)

(52) U.S. Cl.
USPC ........ 455/307; 455/63.1; 455/67.13; 375/350

(58) Field of Classification Search
USPC ............. 455/63.1, 67.13, 295, 296, 307, 339; 375/346, 350; 327/551, 552
See application file for complete search history.

(56) References Cited

U.S. PATENT DOCUMENTS

| | | | | |
|---|---|---|---|---|
| 7,012,487 | B2 * | 3/2006 | Allott | 333/214 |
| 7,317,774 | B2 * | 1/2008 | Richey et al. | 375/355 |
| 7,688,880 | B2 * | 3/2010 | Haub et al. | 375/148 |
| 8,467,760 | B2 * | 6/2013 | Mirzaei et al. | 455/307 |

OTHER PUBLICATIONS

Andrews, et al., "A Passive-Mixer-First Receiver with Baseband-Controlled RF Impedance Matching, < 6dB NF, and > 27 dBm Wideband IIP3," 2010 IEEE International Solid State Circuits Conference, Session 2, mm-Wave Beamforming & RF Building Blocks, 2.5, pp. 46-48.
Andrews, et al., "Implications of Passive Mixer Transparency for Impedance Matching and Noise Figure in Passive Mixer-First Receivers," IEEE Transactions on Circuits and Systems—I: Regular Papers, Dec. 2010, vol. 57, No. 12, pp. 3092-3103.
Andrews, et al., "A Passive Mixer-First receiver with Digitally Controlled and Widely Tunable RF Interface," IEEE Journal of Solid State Circuits, Dec. 2010, vol. 45, No. 12, pp. 2696-2708.

(Continued)

*Primary Examiner* — Quochien B Vuong
(74) *Attorney, Agent, or Firm* — McDermott Will & Emery LLP

(57) ABSTRACT

A high quality factor frequency translated bandpass filter (FTBPF) with harmonic rejection includes multiple transconductance cells configured to convert a received radio frequency (RF) voltage signal into respective RF current signals. Each of the transconductance cells are weighted such that the FTBPF has an effective transconductance of a first magnitude for frequency components of the received RF voltage signal arising from a first harmonic and an effective transconductance of a second magnitude less than the first magnitude for frequency components of the received RF voltage signal arising from harmonics at integer multiples of the first harmonic. The FTBPF also includes multiple frequency conversion cells coupled to the transconductance cells and configured to mix respective ones of the RF current signals with multiple non-overlapping local oscillator signals. The FTBPF also includes multiple baseband impedances coupled to outputs of the frequency conversion cells and ground and are frequency translated by mixed signals from the frequency conversion cells.

20 Claims, 11 Drawing Sheets

(56) References Cited

OTHER PUBLICATIONS

Borremans, et al., "A 40nm CMOS Highly Linear 0.4-to-6GHz Receiver Resilient to 0dBm Out-of-Band Blockers," 2011 IEEE International Solid State Circuits Conference, Session 3, RF Techniques, 3.6, pp. 62-64.

Borremans, et al., "A 40nm CMOS Highly Linear 0.4-to-6GHz Receiver Resilient to 0dBm Out-of-Band Blockers," IEEE Journal of Solid State Circuits, Jul. 2011, vol. 46, No. 7, pp. 1659-1671.

Ru, et al., "A Software Defined Radio Receiver Architecture Robust to Out-of-Band Interface," 2009 IEEE International Solid State Circuits Conference, Session 12, RF Building Blocks, 12.8, pp. 230-233.

Ru, et al., "Digitally Enhanced Software Defined Radio Receiver Robust to Out-of-Band Interference," IEEE Journal of Solid State Circuits, Dec. 2009, vol. 44, No. 12, pp. 3359-3375.

Ru, "Frequency Translation Techniques for Interference-Robust Software-Defined Radio Receivers," Doctoral Thesis, Nov. 2009, 222 pages (uploaded in two parts due to size).

Soer, et al., "A 0.2-to-2.0GHxz CMOS Receiver without LNA Achieving >11dBm IIP3 and <6.5 dB NF," 2009 IEEE International Solid State Circuits Conference, Session 12, RF Building Blocks, 12.4, pp. 222-224.

Franks, et al., "An Alternative Approach to the Realization of Network Transfer Functions: The N-Path Filter," The Bell System Technical Journal, Sep. 1960, pp. 1321-1350.

Von Grunigen, et al., "An Integrated CMOS Switched-Capacitor Bandpass Filter based on N-Path and Frequency-Sampling Principles," IEEE Journal of Solid State Circuits, Dec. 1983, vol. SC-18, No. 6, pp. 753-761.

Sacchi, et al., "A 15 mW, 70 kHz 1/f Corner Direct Conversion CMOS Receiver," 2003 IEEE Custom Integrated Circuits Conference, pp. 459-462.

Lu, et al., "A SAW-less GSM/GPRS/EDGE Receiver Embedded in a 65nm CMOS SoC," 2011 IEEE International Solid State Circuits Conference, Session 21, Cellular, 21.1, pp. 364-366.

Yu, et al., "A SAW-less GSM/GPRS/EDGE Receiver Embedded in a 65nm CMOS SoC," IEEE Journal of Solid-State Circuits, Dec. 2011, vol. 46, No. 12, pp. 3047-3060.

\* cited by examiner

FREQUENCY-TRANSLATIONAL BANDPASS FILTER WITH HARMONIC REJECTION

CROSS-REFERENCE TO RELATED APPLICATIONS

This application claims the benefit of U.S. Provisional Application No. 61/737,078, entitled "FREQUENCY-TRANSLATIONAL BANDPASS FILTER WITH HARMONIC REJECTION," filed Dec. 13, 2012, which is hereby incorporated by reference in its entirety for all purposes.

BACKGROUND

Wideband receivers are configured to provide filtering to most out-of-band blocker signals before any baseband amplification. For example, high-Q frequency translational bandpass filters (FTBPF) have been used in radio frequency (RF) front-ends to provide programmable filtering. However, traditional high-Q FTBPFs replicate a wanted pass-band around a local oscillator (LO) fundamental at LO harmonics. Accordingly, unwanted (or blocker) signals around the LO harmonics are not significantly attenuated. This unnecessary feed-through of blocker signals has potential to saturate the receiver, thus resulting in degradation of performance.

SUMMARY

A circuit is provided for a high-Q frequency-translational bandpass filter to suppress signals at harmonics of the local oscillator frequency, substantially as illustrated by and/or described in connection with at least one of the figures, as set forth more completely in the claims.

BRIEF DESCRIPTION OF THE DRAWINGS

Certain features of the subject disclosure are set forth in the appended claims. However, for purpose of explanation, several implementations of the subject disclosure are set forth in the following figures.

DETAILED DESCRIPTION

It is understood that other configurations of the subject disclosure will become readily apparent to those skilled in the art from the following detailed description, wherein various configurations of the subject disclosure are shown and described by way of illustration. As will be realized, the subject disclosure is capable of other and different configurations and its several details are capable of modification in various other respects, all without departing from the scope of the subject disclosure. Accordingly, the drawings and detailed description are to be regarded as illustrative in nature and not as restrictive.

The subject technology proposes addressing the aforementioned pass-band replication of unwanted signals by providing transconductance cells with varying transconductance weighting such that frequency components of an inbound signal that correspond to local oscillator harmonics are knocked out and wanted frequency components are unattenuated. According to some implementations, the subject technology relates to a circuit for a high quality factor (high-Q) frequency translated bandpass filter with enhanced harmonic rejection, particularly useful for suppression of harmonic blocker signals at integer multiples of a wanted signal.

The circuit includes multiple transconductance cells configured to convert a received radio frequency (RF) voltage signal into multiple RF current signals. Each of the multiple transconductance cells has an effective transconductance of a first magnitude for frequency components of the received RF voltage signal arising from a first harmonic and an effective transconductance of a second magnitude less than the first magnitude for frequency components of the received RF voltage signal arising from harmonics at integer multiples of the first harmonic. The circuit also includes multiple frequency conversion cells coupled to the multiple transconductance cells and configured to mix respective ones of the multiple RF current signals with multiple non-overlapping local oscillator signals. The circuit also includes multiple baseband impedances coupled to outputs of the multiple frequency conversion cells and ground and configured to form a high-Q filter.

Figure 1:
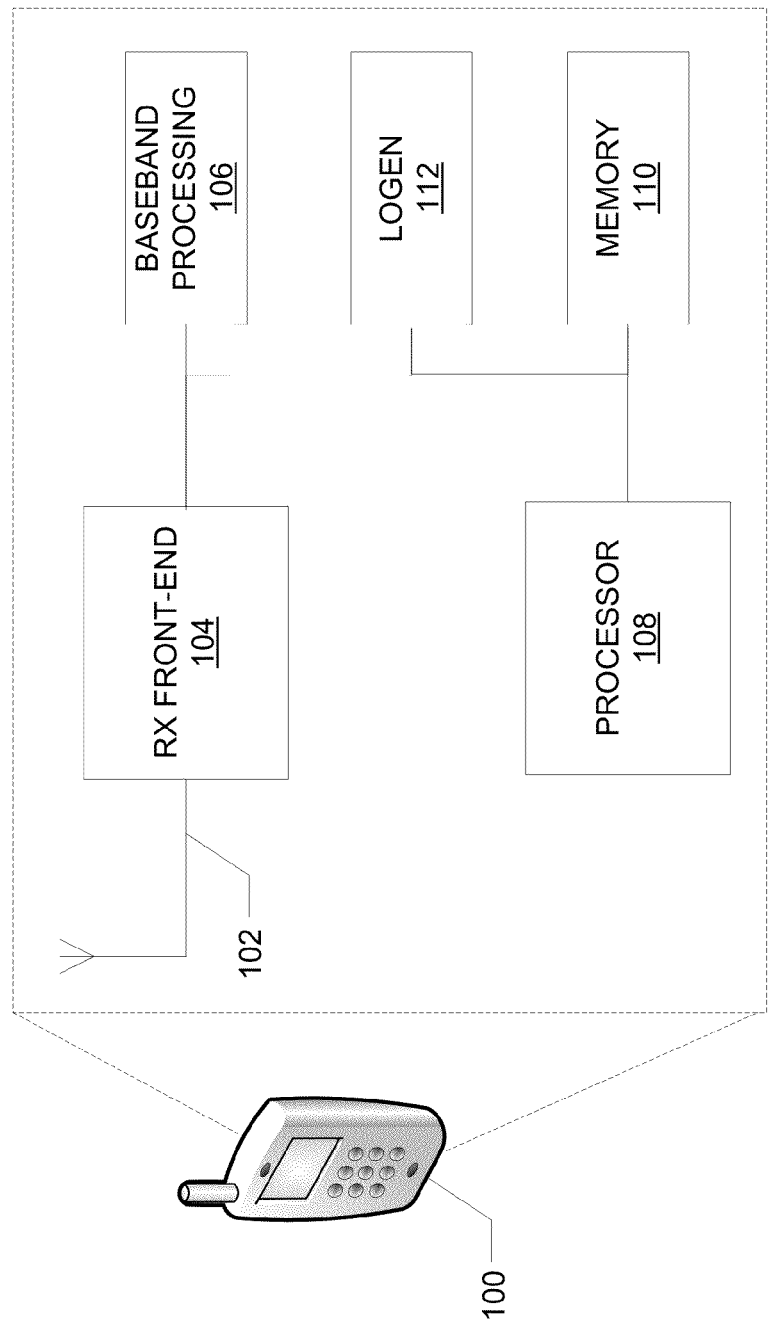
FIG. 1 illustrates a block diagram of a wireless communication device in accordance with one or more implementations.

FIG. 1 illustrates a block diagram of a wireless communication device in which the subject technology may be used in accordance with one or more implementations. Referring to FIG. 1, the wireless communication device 100 includes an antenna 102, a receiver front-end 104, a downconversion and baseband processing module 106, a processor 108, a memory 110, and a local oscillator generator (LOGEN) 112. The blocks represented in FIG. 1 may be integrated on semiconductor substrates. For example, the blocks 104-112 may be realized in a single system-on-chip, or realized in a multi-chip chipset.

The antenna 102 is configured to transmit and/or receive wireless signals over a range of frequencies. Although only a single antenna is illustrated, the subject disclosure is not so limited. The receiver front-end 104 includes logic, circuitry and/or interfaces that is operable to receive and process signals from the antenna 102. The receiver front-end 104, for example, is operable to amplify and/or down-covert received wireless signals. The receiver front-end 104 is operable to cancel noise arising from impedance matching and is linear over a wide range of frequencies. In this regard, the receiver front-end 104 receives signals in accordance with a variety of wireless standards. The receiver front-end 104 may be applicable to standards, including but not limited to, Wi-Fi, WiMAX, Bluetooth, and various cellular standards.

The downconversion and baseband processing module 106 includes logic, circuitry and/or interfaces that is operable to perform processing of baseband signals. The downconversion and baseband processing module 106 may, for example, analyze received signals and generate control and/or feedback signals for configuring various components of the wireless communication device 100 such as the receiver front-end 104. The downconversion and baseband processing module 106 is operable to encode, decode, transcode, modulate, demodulate, encrypt, decrypt, scramble, descramble, and/or otherwise process data in accordance with wireless standards.

The processor 108 includes logic, circuitry and/or interfaces for processing data and/or controlling operations of the wireless communication device 100. In this regard, the processor 108 is configured to provide control signals to various other portions of the wireless communication device 100. The processor 108 may control transfers of data between various portions of the wireless communication device 100. Additionally, the processor 108 may provide for implementation of an operating system or otherwise execute code to manage operations of the wireless communication device 100.

The memory 110 includes logic, circuitry and/or interfaces for storage of various types of information such as received data, generated data, code, and/or configuration information. The memory 110 may include a non-transitory storage medium, including but not limited to, RAM, ROM, flash, and/or magnetic storage. According to some implementations of the subject disclosure, information stored in the memory 110 is utilized for configuring the receiver front-end 104 and/or the downconversion and baseband processing module 106.

The LOGEN 112 includes logic, circuitry and/or interfaces that is operable to generate oscillating signals at multiple frequencies. The LOGEN 112 is operable to generate digital and/or analog signals. In this regard, the LOGEN 112 is operable to generate clock signals and/or sinusoidal signals. Characteristics of the oscillating signals such as the frequency and duty cycle are determined based on control signals from the processor 108 and/or the downconversion and baseband processing module 106.

In operation, the processor 108 may configure the various components of the wireless communication device 100 based on a wireless standard according to which it is desired to receive signals. Wireless signals are received via the antenna 102, amplified and down-converted by the receiver front-end 104. The downconversion and baseband processing module 106 may perform noise estimation and/or noise cancellation, decoding, and/or demodulation of the baseband signals. In this regard, information in the received signal is recovered and utilized appropriately. For example, the information may be audio and/or video to be presented to a user of the wireless communication device, data to be stored to the memory 110, and/or information affecting and/or enabling operation of the wireless communication device 100.

Figure 2:
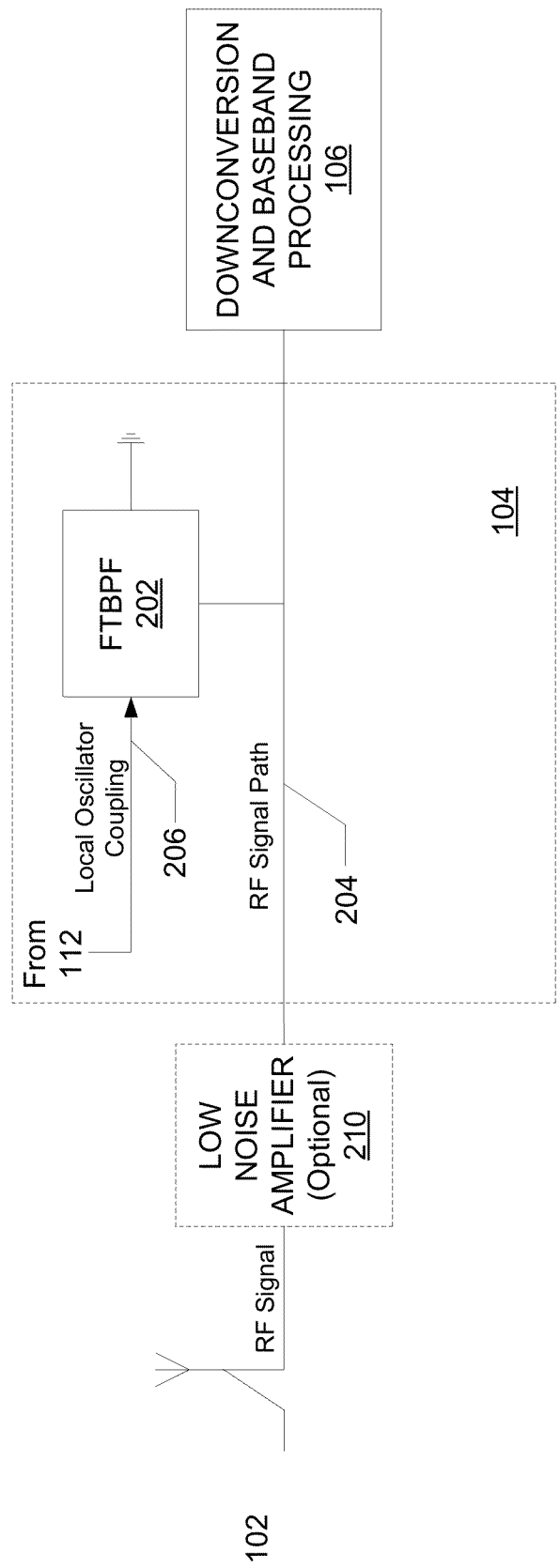
FIG. 2 illustrates a block diagram of a receiver front-end that provides for suppression of harmonic blocker signals in accordance with one or more implementations.

FIG. 2 illustrates a block diagram of the receiver front-end 104 illustrated in FIG. 1 that provides for suppression of out-of-band blocker signals in accordance with one or more implementations. The receiver front-end 104 includes a frequency translated bandpass filter (FTBPF) 202. The receiver front-end 104 connects to the antenna 102 to receive a radio frequency (RF) signal that includes a desired channel. In one or more implementations, the desired channel is positioned within a frequency band defined by a wireless communications standard. The RF signal may be received via an antenna coupling (not shown) to a bond wire (not shown). The bond wire couples the RF signal to an input terminal or pin of a semiconductor substrate (not shown). After reaching the input terminal of the semiconductor substrate, the RF signal is coupled to a single-ended RF signal path 204. Illustrated in FIG. 2, the input of the FTBPF 202 is coupled to the single-ended RF signal path 204. In this regard, the FTBPF 202 as shown in FIG. 2 is a one terminal device. In one or more implementations, the receiver front-end 104 is coupled to an optional low-noise amplifier (LNA) 210.

A bandpass filter is a device that passes frequencies within a certain range (e.g., pass-band) and rejects (or attenuates) frequencies outside that range (e.g., stop-band). Frequency components of a signal applied at the input of the bandpass filter that fall outside the pass-band are precluded from being passed through to the filter output. All other frequency components of the signal, outside the pass-band, are passed through to the filter output without attenuation.

The RF signal is provided to the FTBPF 202, via the single-ended RF signal path 204, to attenuate blocker signals outside the band containing the desired channel. As discussed below, the FTBPF 202 includes a passive mixer and a baseband impedance that forms a high-Q lowpass filter. The baseband impedance may be a capacitor, a switched capacitor filter, a switch capacitor resistance, and/or a complex impedance. The passive mixer is configured to translate the baseband impedance to a higher frequency by an amount equivalent to the frequency of a local oscillator (LO) signal with a specified duty-cycle received at the LO coupling 206. The translated baseband impedance forms a high-Q filter coupled between the RF signal, received via the single-ended RF signal path 204, and ground.

The pass-band presented by the FTBPF 202 can be tuned to (e.g., centered within) either the frequency band of the RF signal that contains the desired channel or to the desired channel itself. Specifically, the LO signal received at the LO coupling 206 can be adjusted to have a frequency equivalent to either the center frequency of the band containing the desired channel or to the center frequency of the desired channel itself. Moreover, the bandwidth of the pass-band presented by the FTBPF 202 may be designed to encompass either the band containing the desired channel or the desired channel itself. According to some implementations, the FTBPF 202 provides a high-impedance path to ground for either the entire frequency band containing the desired channel or the desired channel itself, and a low impedance path to ground for out-of-band blocker signals.

Since out-of-band blocker signals will not develop a voltage across the impedance provided by the FTBPF 202, they will be attenuated. Frequency components within the pass-band of the FTBPF 202, however, will develop a voltage across the impedance provided by the FTBPF 202 and, thus, will be provided to the downconversion and baseband processing module 106 (FIG. 1) for further processing (e.g., low-pass filtering, digitization, demodulation).

Figure 3:
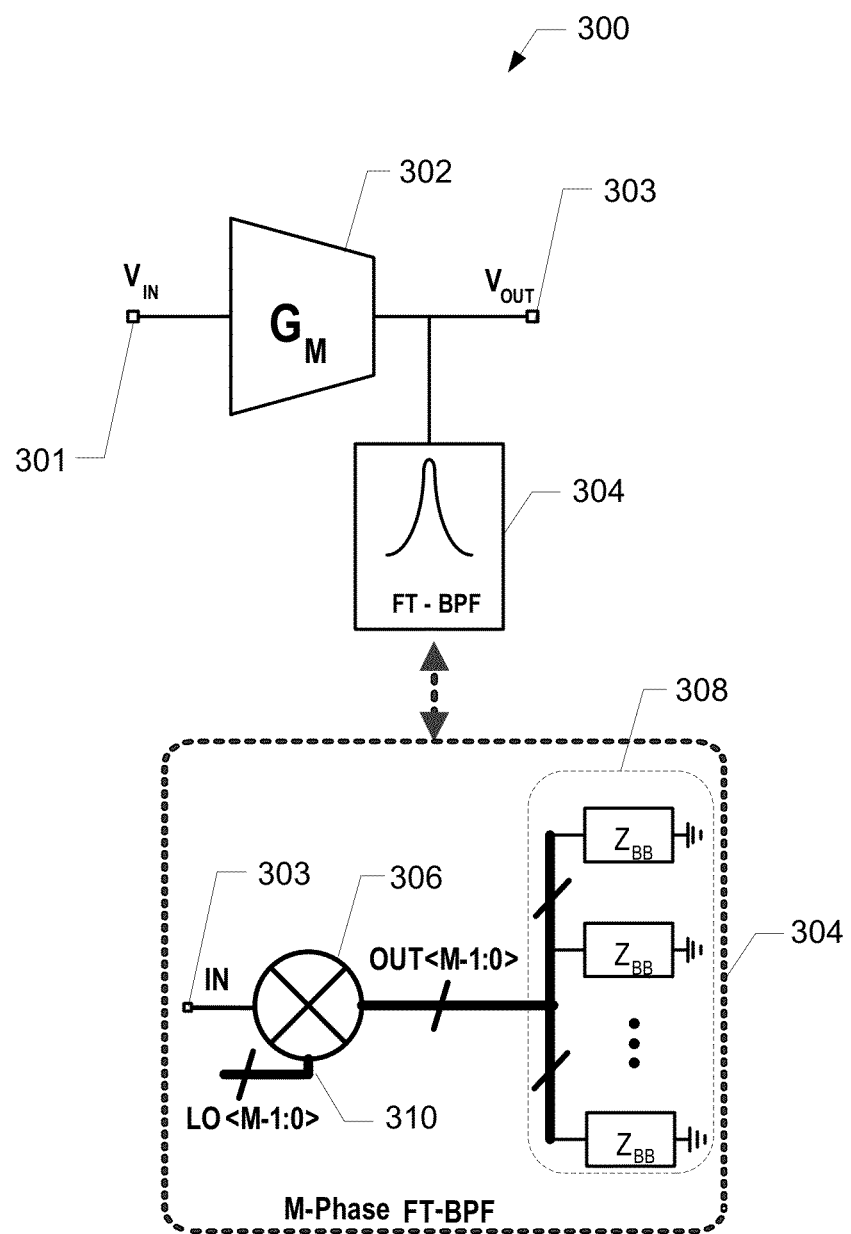
FIG. 3 illustrates a conceptual diagram of a frequency-translated high-Q bandpass filter in accordance with one or more implementations.

FIG. 3 illustrates a conceptual diagram of a high-Q filter 300 in accordance with one or more implementations. The high-Q filter 300 employs a transconductance cell 302 coupled to an M-phase frequency translated bandpass filter (FTBPF) 304 at a node 303. The M-phase FTBPF 304 includes a passive mixer 306 and baseband impedances 308.

In one or more implementations, the M-phase FTBPF 304, illustrated in FIG. 3, provides viable implementations for use within many RF receiver designs. The M-phase FTBPF 304 is single-ended and processes a single-ended RF signal, via a transconductance cell 302, received at a node 301. According to some implementations, the individual baseband impedances 308 are high-Q lowpass filters. The baseband impedances 308 may include a capacitor, a switched capacitor filter, a switch capacitor resistance, and/or a complex impedance. The passive mixer 306 is configured to translate the baseband impedances 308 to a higher frequency. Specifically, the passive mixer 306 is configured to translate the baseband impedances 308 to a higher frequency substantially equal to a fundamental frequency (e.g., $\omega_{LO}$) of local oscillator (LO) signals 310 received by the passive mixer 306. The translated baseband impedance (e.g., $Z_{IN}$) forms a high quality factor (high-Q) filter that is presented at the node 303. In addition, the transconductance cell 302 realizes a voltage gain $$\left(\text{e.g., } \frac{V_{OUT}}{V_{IN}}\right)$$

between the node 301 and the node 303.

Since the impedance of the baseband impedances 308 varies with the frequency of the signal applied across their terminals, it follows that the frequency conversion of the RF signal by the passive mixer 306 alters the impedance seen by the RF signal at the node 303. Specifically, the baseband impedances 308 will each appear translated by $\pm\omega_{LO}$ (e.g., the fundamental frequency of the LO signals 310) as seen by the RF signal at the node 303. In other words, the low-Q bandpass filter formed by the baseband impedances 308 is substantially translated by $\pm\omega_{LO}$, thus becoming a high-Q filter presented at the node 303.

The high-Q filter 300 provides frequency translation of the RF signal at the node 303 by the sum ($\omega_{RF}+\omega_{LO}$) and difference ($\omega_{RF}-\omega_{LO}$ or $\omega_{LO}-\omega_{RF}$) in frequency between the LO signals 310 and the input signal at the node 301. However, due to upper harmonics of the LO signals 310, it can be shown that the high-Q filter 300 further provides frequency conversion of the RF signal by the sum ($\omega_{RF}+(M-1)*\omega_{LO}$) and difference ($\omega_{RF}-(M-1)*\omega_{LO}$ or $(M-1)*\omega_{LO}-\omega_{RF}$) in frequency between the $(M-1)^{th}$ harmonic of the LO signals 310 and the RF signal, where M defines the number of LO phases employed.

The RF signal received at the node 301 provides a range of frequencies, $\omega_A-\omega_B$, that contain desired information. In one or more implementations, $\omega_A-\omega_B$ spans the frequency spectrum from 3.1 GHz and 10.6 GHz and contains information communicated from an ultra-wideband (UWB) transmitter. The translated baseband impedance $Z_{IN}$ is centered within a certain portion of the frequency band $\omega_A-\omega_B$, such that desired information contained at and around that frequency within the RF signal can be retrieved. Specifically, the translated baseband impedance is centered at $\omega_{LO}$.

In one or more implementations, the high-Q filter 300 presents a large impedance to the RF signal received at the node 303. Specifically, the large impedance effectively prevents frequency components of the RF signal that fall within the pass-band from being attenuated. However, the translated baseband impedance quickly decreases for frequency components of the RF signal that are offset from $\omega_{LO}$. Thus, these frequency components of the RF signal are attenuated.

Figure 4:
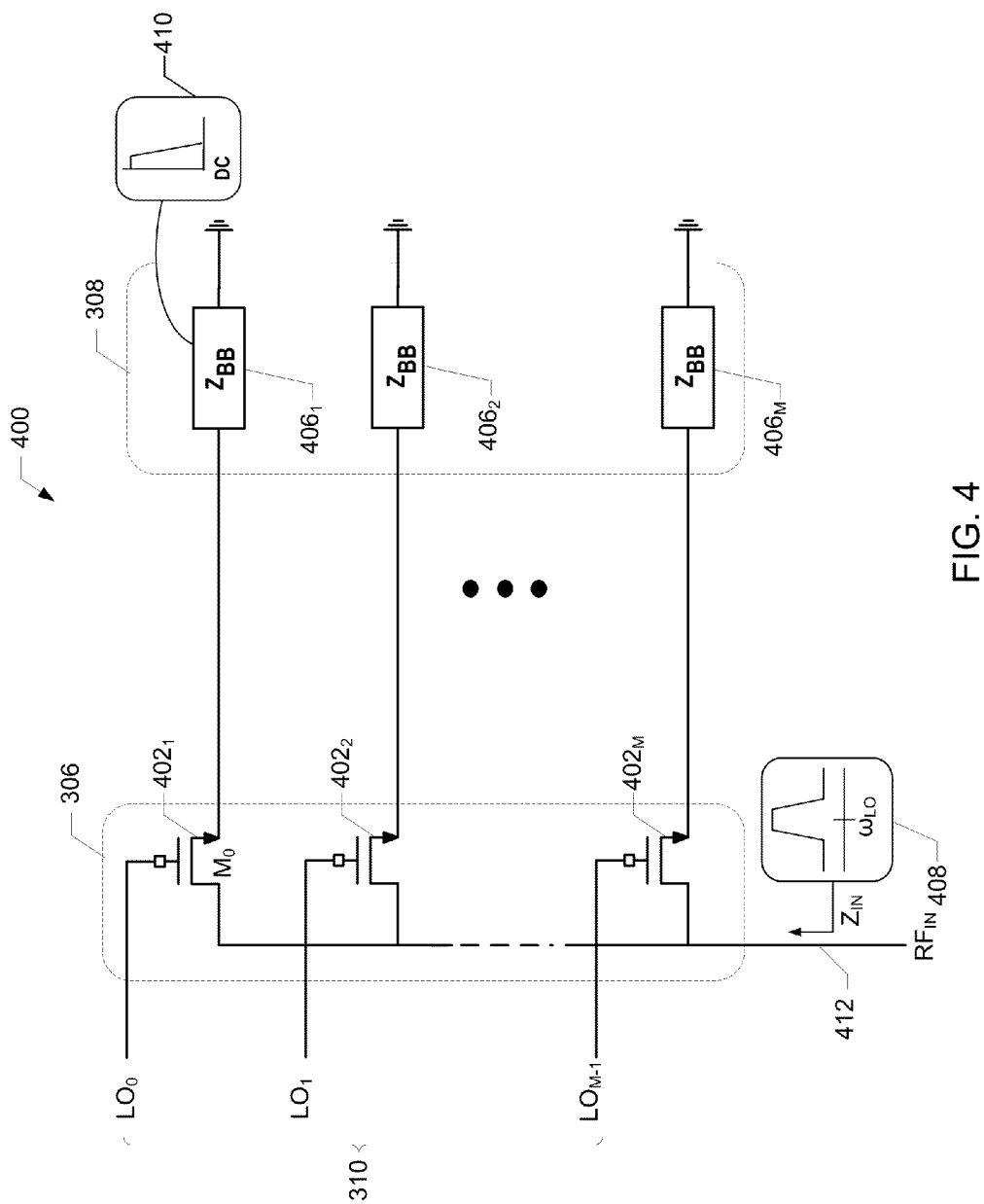
FIG. 4 illustrates a block diagram of a frequency-translated high-Q bandpass filter in accordance with one or more implementations.

FIG. 4 illustrates a block diagram of a frequency-translated bandpass filter 400 as provided in the M-phase FTBPF 304 illustrated in FIG. 3 in accordance with one or more implementations. The frequency translated bandpass filter 400 in its single-ended format, is composed of the passive mixer 306 and the baseband impedances 308. According to some implementations, the passive mixer 306 is composed of switching devices 402$_1$-402$_M$ and the baseband impedances 308 include baseband impedances 406$_1$-406$_M$, where M represents the number of LO phases employed. The baseband impedances 406$_1$-406$_M$ may include a capacitor, a switched capacitor filter, a switch capacitor resistance, and/or a complex impedance.

The passive mixer 306 uses the local oscillator (LO) signals 310 to down-convert or up-convert an RF signal input 412 (e.g., $RF_{IN}$). For example, the passive mixer 306 is configured to down-convert the RF signal input 412 using respective ones of the LO signals 310 received via the LO coupling 206 (FIG. 2). Specifically, during down-conversion, harmonics of the LO signal may be present that cause RF input signals at multiples of the LO frequency to directly interfere with each other.

A translated baseband impedance 408 (e.g., $Z_{IN}$), centered around a fundamental frequency (e.g., $\omega_{LO}$), is presented by the frequency translated bandpass filter 400 at the RF signal input 412. The translated baseband impedance 408, in view of the baseband impedances 406$_1$-406$_M$, can be frequency shifted to the RF frequency (e.g., $\omega_{RF}$). Therefore, a lowpass filter can be converted to a bandpass filter, whose center is controlled by respective ones of the LO signals 310. That is, the lowpass filter is frequency translated to the desired RF frequency to produce a bandpass high-Q RF or intermediate frequency (IF) filter via the LO signals 310 provided by a clock generator (not shown). The high-Q filter may be other types of filters such as a high-Q frequency translated notch filter (FTNF).

Illustrated in FIG. 4, the passive mixer 306 provides multiple frequency conversion branches. Each frequency conversion branch includes a switching device coupled at its gate to a respective one of the LO signals 310, at its source to the RF signal input 412, and at its drain to a respective one of the baseband impedances 308. For example, the first frequency conversion branch illustrated in FIG. 4 includes a switching device 402$_1$ represented as an n-type metal oxide semiconductor (NMOS) device $M_0$, which is coupled at its gate to a LO signal $LO_0$, at its source to the RF signal input 412, and at its drain to a baseband impedance 406$_1$. The switching devices 402$_1$-402$_M$ are not limited to NMOS devices and can be implemented using any suitable switching device, including p-type metal oxide semiconductors (PMOS).

The switching devices 402$_1$-402$_M$ may be clocked by the LO signals 310 represented as M periodic non-overlapping clocks, $LO_0$, $LO_1$, . . . , $LO_{M-1}$, with a duty-cycle of 1/M. Given that M represents the number of LO signals employed, that number of LO signals may be determined according to a number of harmonics present around a fundamental frequency (e.g., $\omega_{LO}$). The switching devices 402$_1$-402$_M$ are switched ON and OFF at a rate substantially equal to the fundamental frequency of the LO signals 310. The toggle rate of the switching devices 402$_1$-402$_M$ effectively multiplies the RF signal input 412, coupled to the sources of the switching devices 402$_1$-402$_M$, by respective ones of the LO signals 310. This effective multiplication results in frequency conversion of the RF signal input 412 by the sum ($\omega_{RF}+\omega_{LO}$) and difference ($\omega_{RF}-\omega_{LO}$ or $\omega_{LO}-\omega_{RF}$) in frequency between the LO signals 310 and the RF signal input 412. The frequency-converted RF signals are each provided to the baseband impedances $406_1$-$406_M$ via the drains of the switching devices $402_1$-$402_M$.

According to some implementations, the baseband impedances $406_1$-$406_M$ (e.g., $Z_{BB}$) each provide a lowpass baseband filter. Each of the baseband impedances may be a capacitor, a switched capacitor filter, a switch capacitor resistance, and/or a complex impedance. Note that the impedance of each of the baseband impedances $406_1$-$406_M$ may be the same or different. Further note that each of the baseband impedances $406_1$-$406_M$ may be adjusted to adjust the properties of the low-Q baseband filter (e.g., bandwidth, attenuation rate, or quality factor). While the switching devices $402_1$-$402_M$ are coupled to the baseband impedances $406_1$-$406_M$, the switching devices $402_1$-$402_M$ are connected to the RF signal input 412 with a relatively large output impedance. In one or more implementations, the output impedance is 100 ohms (Ω) or greater.

As noted above, the baseband impedances $406_1$-$406_M$ may be capacitors that are respectively coupled between the drains of the switching devices $402_1$-$402_M$ and ground. The baseband impedances $406_1$-$406_M$ are each substantially equivalent and their impedances are given by (ignoring parasitics):

$$Z_{BB}(j\omega) = \frac{1}{j\omega C} \quad (1)$$

where j is the imaginary unit, ω is the frequency of the signal applied across the capacitor, and C is the capacitance. As may be readily apparent from the above equation, $Z_{BB}$ presents a large impedance for direct current (DC) signals. However, as the frequency of the applied signal moves in either the positive or negative direction, away from DC (e.g., 0 MHz), the impedance $Z_{BB}$ decreases. Thus, the baseband impedances $406_1$-$406_M$ effectively form a lowpass filter centered at baseband 410 (e.g., 0 MHz).

The frequency translated bandpass filter 400 may be configured to provide a low-impedance path to blocker signals whose distance to the LO frequency is greater than the lowpass filter bandwidth, while maintaining a large impedance for the frequency components of interest near the fundamental frequency. In other words, the frequency translated bandpass filter 400 can be utilized as an on-chip high-Q filter.

The $\omega_{LO}$ can be adjusted to any frequency portion within a frequency band $\omega_A$-$\omega_B$. By adjusting $\omega_{LO}$ to have a frequency substantially equal to the center frequency of the desired channel, the translated baseband impedance 408 can effectively provide a filter to attenuate frequency components of the RF signal outside the desired channel.

However, as noted above, the RF signal input 412 is frequency converted by the sum ($\omega_{RF}$+(M−1)*$\omega_{LO}$) and difference ($\omega_{RF}$−(M−1)*$\omega_{LO}$ or (M−1)*$\omega_{LO}$−$\omega_{RF}$) in frequency between the (M−1)$^{th}$ harmonic of the LO signals 310 and the RF signal input 412, where M is the number of LO phases employed. Therefore, the frequency components of the RF signal input 412 at and around (M−1)*$\omega_{LO}$ and (M+1)*$\omega_{LO}$ will be frequency-translated to $\omega_{LO}$ and will fall within the pass-band of the translated baseband impedance 408.

In one or more implementations, a differential FTBPF can be designed for use in wideband RF receivers (e.g. UWB and TV receivers). The differential FTBPF may be configured to receive a differential RF signal input (e.g., $RF_{IN+}$ and $RF_{IN-}$) at a differential input pair. The differential FTBPF may include a passive mixer and a baseband impedance. The baseband impedance may include M capacitors (e.g., $C_{BB0}$-$C_{BBM}$) that can each be considered as lowpass filters. The passive mixer may be configured to translate the baseband impedance to a higher frequency. Specifically, the passive mixer is configured to translate the baseband impedance to a higher frequency substantially equal to the fundamental frequency of the LO signals 310 received by the passive mixer. The translated baseband impedance 408 forms a high-Q filter that is presented at the differential input pair.

Figure 10:
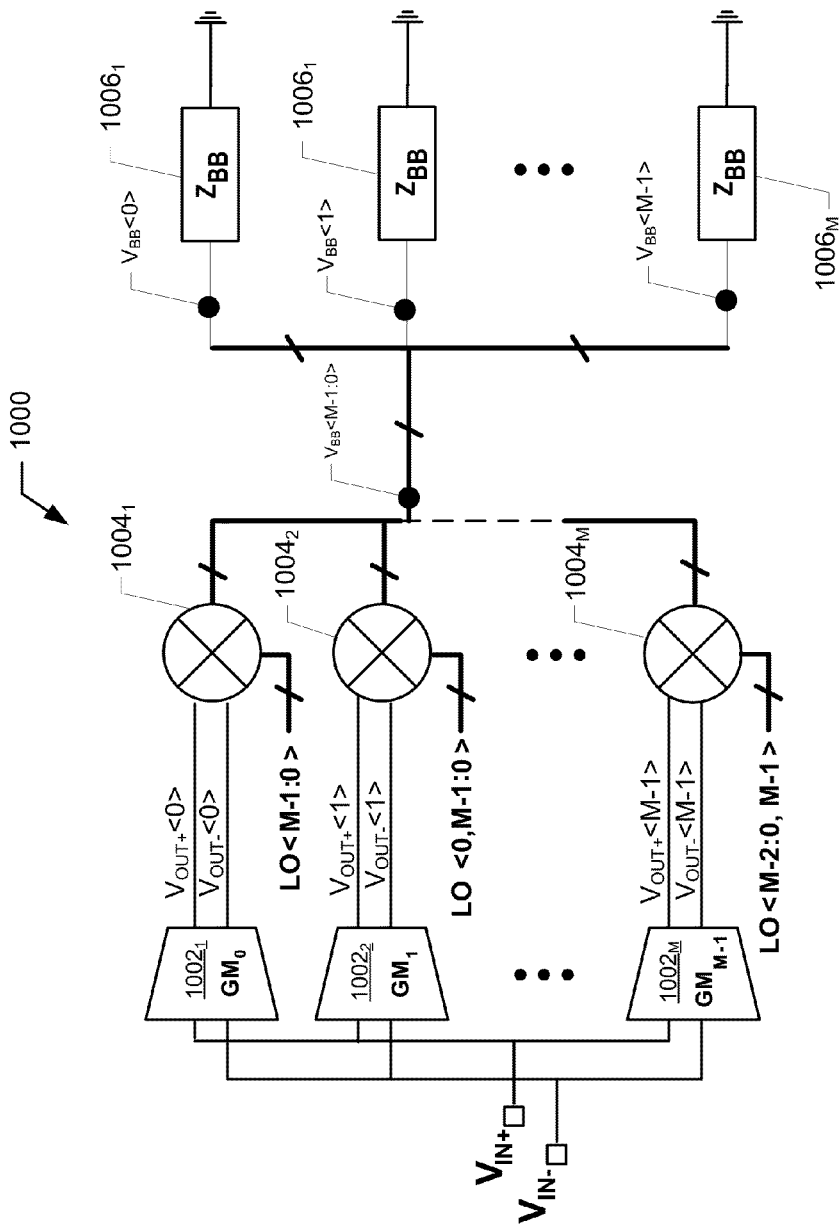
FIG. 10 illustrates a conceptual diagram of a differential high-Q filter with enhanced harmonic rejection in accordance with one or more implementations.

In some implementations, the differential FTBPF, which will be discussed in greater detail in FIG. 10, is substantially similar in structure to a single-ended FTBPF. However, the differential FTBPF contains twice the number of frequency conversion branches (e.g., 2*M), each including a switching device. Half of the frequency conversion branches of the differential FTBPF are dedicated to the positive-end of the RF signal received at a first input of the differential input pair and the other half is dedicated to the negative-end of the RF signal received at a second input of the differential input pair. Moreover, it should be noted that the variable, M, is assumed to be even for the differential FTBPF. However, for an odd value of M, each frequency conversion branch of the differential FTBPF will require a separate capacitor within the baseband impedance. In other words, 2*M capacitors will be required for the differential FTBPF when M is equal to an odd integer.

Figure 5:
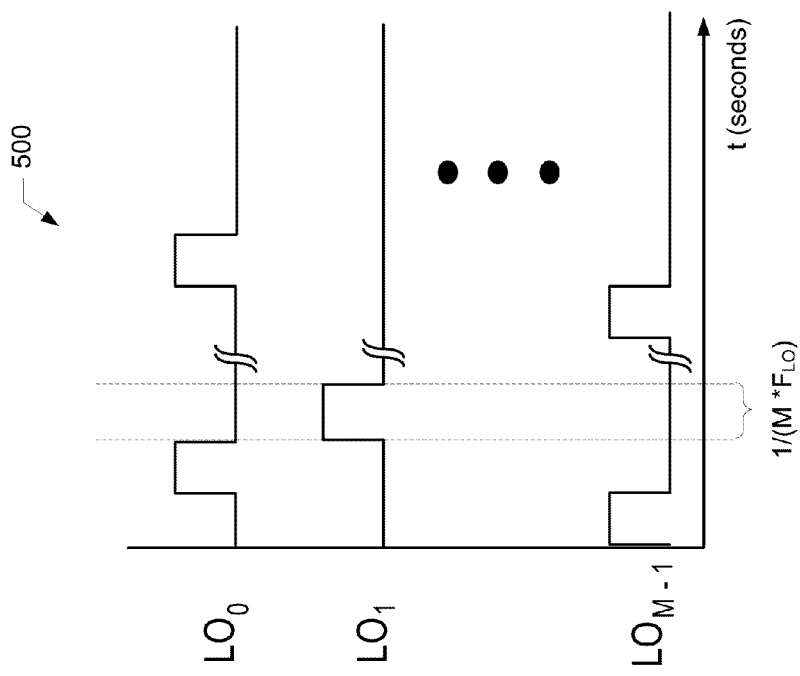
FIG. 5 illustrates a waveform diagram of local oscillator signals for use by the frequency-translated bandpass filter illustrated in FIG. 4 in accordance with one or more implementations.

FIG. 5 illustrates a waveform diagram of local oscillator (LO) signals 500 for use by the frequency-translated bandpass filter 400 illustrated in FIG. 4 in accordance with one or more implementations. The LO signals 500 each correspond to a fundamental frequency (e.g., $\omega_{LO}$). Additionally, the LO signals 500 have successive phase shifts substantially equal to 360°/M degrees and have duty cycles substantially equal to 1/M, where M is the number of LO signals employed.

According to some implementations, the LO signals 500 approximate a square waveform. Unlike a single-tone sinusoidal waveform, the square waveform contains harmonics at specific multiples of the fundamental frequency of the LO signal. Consequently, the output signal generated by the passive mixer 306 (FIG. 3) using the square waveform as a LO signal can contain harmonics corresponding to the LO frequency.

According to some implementations, the number of harmonics presented around the fundamental frequency is equal to 8. As such, the M-phase FTBPF 304 (FIG. 3) utilizes 8 different LO signals; namely, $LO_0$, $LO_1$, $LO_2$, up to $LO_7$. These eight LO signals each have successive phase shifts substantially equal to 360/8 degrees or 45 degrees. In addition, the duty cycle of each LO signal is substantially equal to $$\frac{1}{8}$$

or 12.5%.

Figure 6:
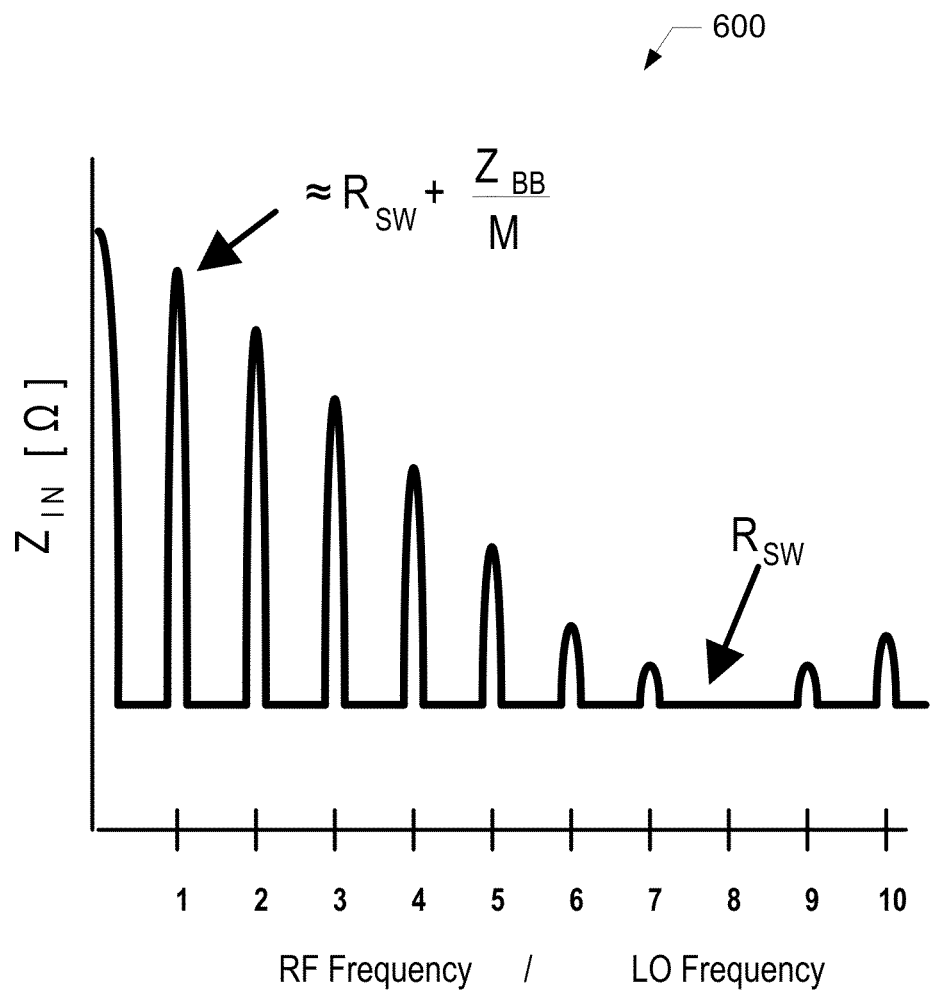
FIG. 6 illustrates a waveform diagram of an input impedance seen by the frequency-translated bandpass filter illustrated in FIG. 4 in accordance with one or more implementations.

FIG. 6 illustrates a waveform diagram 600 of an input impedance seen by the frequency-translated bandpass filter 400 illustrated in FIG. 4 in accordance with one or more implementations. It can be shown that the input impedance is equivalent to the translated baseband impedance 408 (FIG. 4), which is given by:

$$Z_{IN}(j\omega_{RF}) = R_{SW} + \frac{N}{\pi^2}\sin^2\left(\frac{\pi}{N}\right)\{Z_{BB}(j\omega_{RF} - j\omega_{LO}) + Z_{BB}(j\omega_{RF} + j\omega_{LO})\} \quad (2)$$

where $\omega_{RF}$ is the frequency of the RF signal input 412 (FIG. 4), $\omega_{LO}$ is the fundamental frequency of the LO signals received at the LO coupling 206 (FIG. 2), $R_{SW}$ is the switch resistance of the switching devices $402_1$-$402_M$ (FIG. 4), and N is the number of LO phases employed.

In one or more implementations, translated baseband impedance 408 (e.g., $Z_{IN}$) is determined such that a high-impedance path to ground is presented for frequency components of the RF signal input 412 within a desired frequency band and a low-impedance path to ground for frequency components of the RF signal input 412 outside the desired frequency band. The high-impedance path effectively precludes frequency components of the RF signal input 412 that are within the desired frequency band from being attenuated (e.g., pass-band). Conversely, the low-impedance path effectively allows frequency components of the RF signal input 412 outside the desired frequency band to be attenuated (e.g., stop-band). In other words, frequency components of the RF signal input 412 outside the desired frequency band are filtered.

The input impedance seen from the RF signal 412 of the frequency translated bandpass filter 400 (FIG. 4), is equivalent to a switch resistance (e.g., $R_{SW}$) except around harmonics of the LO frequency where the input impedance is equivalent to:

$$Z_{IN} \cong R_{SW} + \frac{Z_{BB}}{M} \quad (3)$$

where M is a positive integer and represents the number of LO phases employed, $R_{SW}$ is the switch resistance of switching devices $402_1$-$402_M$, and $Z_{BB}$ is the impedance of the baseband impedances $406_1$-$406_M$. Equation (3) is an approximation of equation (2) provided above. The switch resistance represents the impedance of the switching devices $402_1$-$402_M$ (FIG. 4). At these frequencies, the input impedance is equal to the baseband impedance frequency shifted to these frequencies. Thus, the input impedance, if inserted at a node inside the receiver front-end 104 (FIG. 1), all incoming frequencies at that node except those residing at $\omega_{LO}$ and its harmonics are subject to attenuation. While it may be desirable to have a high-Q filter centered only around the LO frequency, components from around $2\omega_{LO}$ up to around $7\omega_{LO}$, for example, will also feed-through (e.g., with less gain compared with the desired input components at $\omega_{LO}$), but with minimal folding.

In one or more implementations, the input impedance is based on the assumption that the input is an ideal RF current source. The frequency translated bandpass filter 400 may be a linear-time-variant (LTV) system, and higher order up/down conversions modify the effective impedance observed at the fundamental frequency. The input impedance seen from the frequency translated bandpass filter 400 is coupled to the RF impedance. Therefore, the input impedance may not be independent of the RF impedance. As a result, when a respective one of the baseband impedances $406_1$-$406_M$ is a capacitor, the input impedance becomes finite and the quality factor of the frequency translated bandpass filter 400 becomes a function of the RF impedance.

Figure 7:
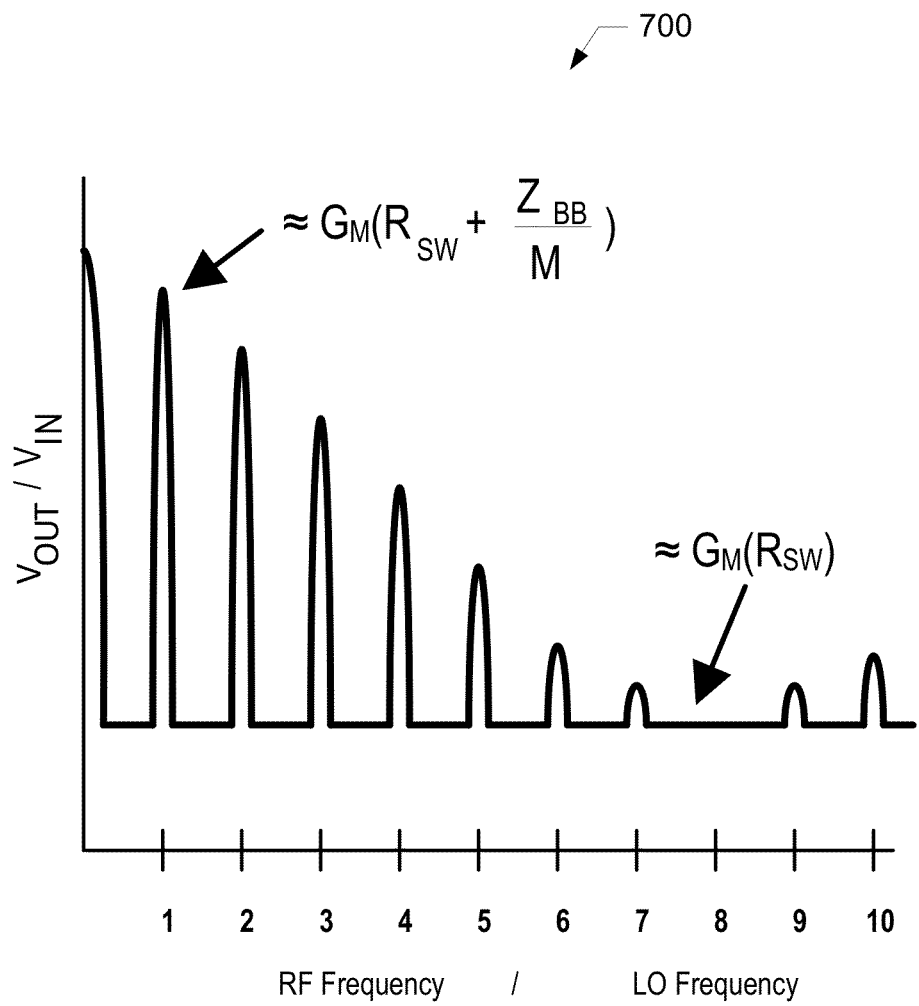
FIG. 7 illustrates a waveform diagram of a gain realized by the high-Q filter illustrated in FIG. 3 in accordance with one or more implementations.

FIG. 7 illustrates a waveform diagram 700 of a gain realized by the high-Q filter 300 illustrated in FIG. 3 in accordance with one or more implementations. The gain (e.g., $V_{OUT}/V_{IN}$) realized at the output of the high-Q filter 300 can be defined as:

$$\approx G_M \left( R_{SW} + \frac{Z_{BB}}{M} \right) \quad (4)$$

where $G_M$ is the factor of proportionality between an input voltage and output current (e.g., transconductance), M represents the number of LO phases employed, $R_{SW}$ is the switch resistance of switching devices $402_1$-$402_M$, and $Z_{BB}$ is the impedance of the baseband impedances $406_1$-$406_M$.

Illustrated in FIG. 7, a voltage gain can be realized for harmonics around the fundamental frequency, including unwanted signals (or blocker signals) at integer multiples of a wanted signal (e.g., first harmonic). The gain realized at the harmonics of the LO fundamental decreases as the frequency increases. For example, the gain at the eighth harmonic is given by $G_M$ ($R_{SW}$) since the baseband impedance for the eighth harmonic was substantially equivalent to zero.

Figure 8:
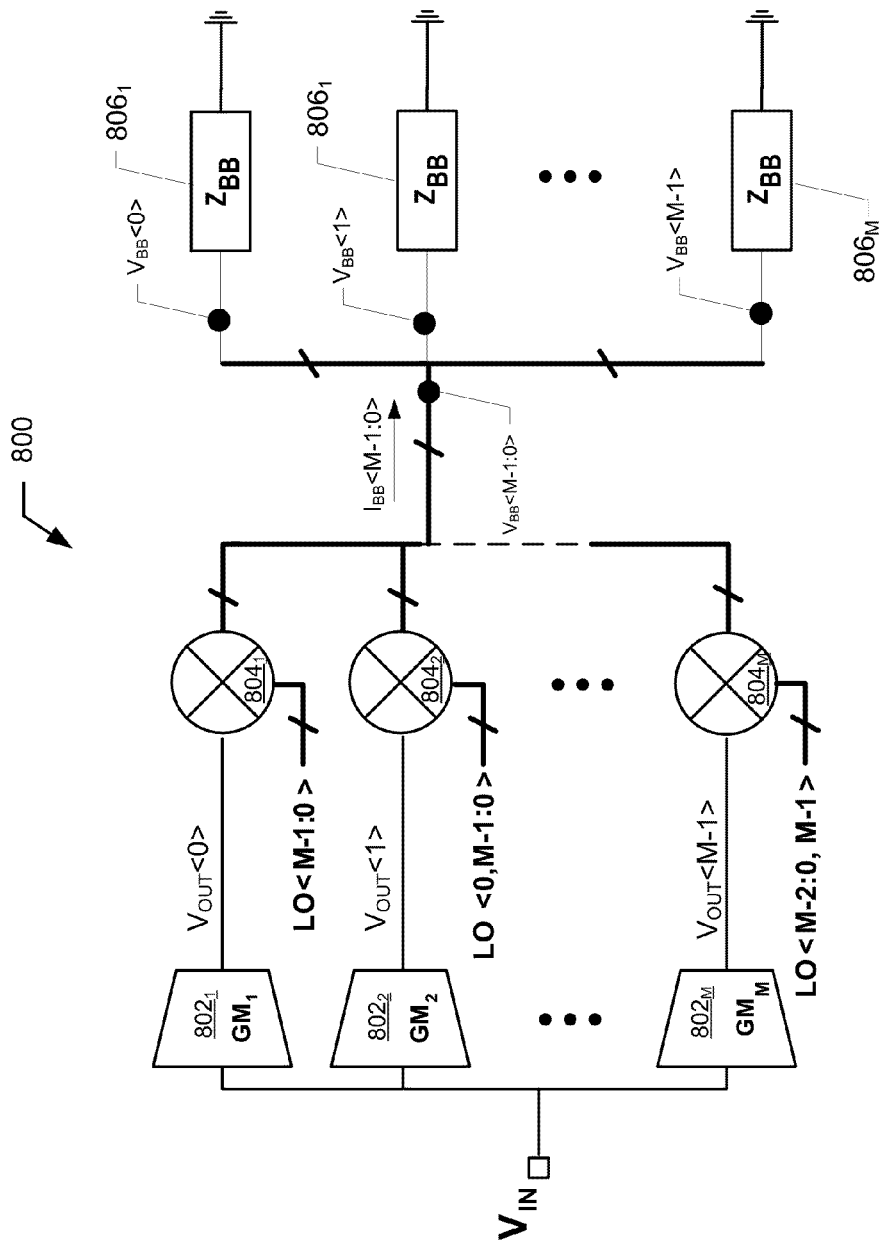
FIG. 8 illustrates a conceptual diagram of a single-ended high-Q filter with enhanced harmonic rejection in accordance with one or more implementations.

FIG. 8 illustrates a conceptual diagram of a single-ended high-Q FTBPF filter 800 with enhanced harmonic rejection in accordance with one or more implementations. A traditional high-Q FTBPF replicates the wanted pass-band around the LO fundamental at all LO harmonics. Because the passband is replicated at LO harmonics, any unwanted signal or blocker signal that is present at these frequencies will not be attenuated and can, therefore, saturate the receiver or introduce distortion. For wideband RF receivers, the higher-order harmonic effects that result from an M-phase FTBPF can cause significant interference with a desired portion of an RF signal. As such, the high-Q FTBPF 800 overcomes these previous limitations and provides a practical implementation of a high-Q RF filter for eliminating multiple pass-band effect.

The high-Q FTBPF 800 performs a filtering technique to eliminate multiple pass-band effect by placing multiple stages of frequency translated bandpass filters at a node within the receiver front-end 104 (FIG. 1). In one or more implementations, the singled-ended high-Q FTBPF employs multi-path filtering, in which the low-pass impedance path is up-converted to the RF frequency as a baseband impedance using multiple frequency conversion mixers (e.g., $804_1$-$804_1$). The high-Q FTBPF 800 also employs multiple transconductance cells (e.g., $802_1$-$802_1$) to directly receive the inbound RF voltage signal (e.g., $V_{IN}$) for conversion to a current signal before mixing (or multiplying) the current signal with multiple phased LO signals (e.g., LO<M−1:0>). In this regard, each of the mixed RF signals is phase-shifted according to the respective LO signal, which may include an unwanted blocker signal at frequency $f_b$, and a wanted signal at frequency $f_w$, where $f_b$ is some integer multiple of $f_w$. Although the bandwidth around these LO harmonics is very small, blocker signals located at these specific harmonic frequencies potentially saturate the receiver. Although the transconductance cells are voltage-to-current converters, the outputs of the transconductance cells can realize a voltage (e.g., $V_{OUT}$) using impedances as seen at inputs of the frequency conversion mixers.

In one or more implementations, each of the transconductance cells $802_1$-$802_1$ is configured with a transconductance gain relative to one another. That is, each of the multiple transconductance cells has a transconductance weighting equivalent to:

$$GM_X = k \left[ 1 + \cos\left(\frac{2\pi X}{M}\right) \right], X = 0, 1, 2, \ldots M-1 \quad (5)$$

or possibly, $$GM_X = k\left[\cos\left(\frac{2\pi X}{M}\right)\right], X = 0, 1, 2, \ldots M-1 \quad (6)$$

when a fully differential design is employed and fully-differential RF inputs are available, where X is an integer that represents each individual GM cell, M is a number of LO phases employed, and k is an arbitrary constant that determines the effective transconductance of the transconductance cell.

Alternatively, each of the multiple transconductance cells has a transconductance weighting equivalent to equation (6), shown above, when single-ended frequency conversion cells are employed (in other words fully-differential inputs are available). The output voltage of the high-Q FTBPF 800 is realized by the weighting of the output node at each transconductance cell given by:

$$V_{OUT} = \sum_{0}^{M-1} V_{OUT}\langle X\rangle\left(e^{\frac{j2\pi X}{M}}\right) \quad (7)$$

This can be accomplished any number of ways, using either an alternate down conversion path or RF phase-shifters. Alternatively, the individual output voltages (e.g., $V_{OUT}\langle X\rangle$) can be considered as the outputs of the system as each output experiences the same beneficial filtering profile.

The high-Q FTBPF 800 also includes multiple frequency conversion cells 804$_1$-804$_M$. Each of the frequency conversion cells 804$_1$-804$_M$ is configured to receive multiple non-overlapping local oscillator (LO) signals (e.g., LO<M−1:0>). The multiple non-overlapping LO signals have successive phase shifts substantially equal to 360/M degrees. The multiple non-overlapping LO signals each have a fundamental frequency equivalent to $\omega_{LO}$. M may be determined based on a number of harmonics around the fundamental frequency.

Each of the frequency conversion cells 804$_1$-804$_M$ is further configured to mix a respective RF current signal with all LO signals to produce multiple downconverted current signals. Given that the transconductance weighting produces weighted current signals, the downconverted current signals corresponding to harmonic multiples of the wanted signal (i.e. unwanted harmonic blockers) are not passed to the baseband impedances 806$_1$-806$_M$. This is because the weighting causes the effective transconductance to be substantially large for harmonics corresponding to the wanted signal and zero for harmonics corresponding to the unwanted signals.

The baseband impedances 806$_1$-806$_M$ are coupled to the multiple frequency conversion cells and ground and are configured to provide a high quality factor (high-Q) filter when frequency translated by the frequency conversion cells 804$_1$-804$_M$. In one or more implementations, the number of baseband impedance 806$_1$-806$_M$ may be the same and/or different from the number of transconductance cells 802$_1$-802$_M$ and frequency conversion cells 804$_1$-804$_M$ provided within the high-Q FTBPF 800.

The harmonic rejection provided within the high-Q FTBPF 800 can be implemented in any variation of high-Q frequency translation filters, including but not limited to, bandpass filters and stop-band filters. The frequency translated bandpass filter can be configured to be fully differential. In this regard, the transconductance cells 802$_1$-802$_M$ can be configured with fully differential inputs. The output voltage realized by the weighting of each differential transconductance cell can be defined as:

$$V_{OUT} = \sum_{0}^{\frac{M}{2}-1} V_{OUT}\langle X\rangle\left(e^{\frac{j2\pi X}{M}}\right) \quad (8)$$

where X is an integer that represents an integer multiple of the wanted signal, and M is a number of LO phases employed.

As noted above, a translated baseband impedance at an input to the transconductance cells 802$_1$-802$_M$ is equivalent to the baseband impedances 804$_1$-804$_M$ translated in frequency by $\omega_{LO}$. The baseband impedances 804$_1$-804$_M$ are each low-pass filters. In addition, the multiple baseband impedances 804$_1$-804$_M$ are translated as seen by the input RF voltage signal at an input to the transconductance cells 802$_1$-802$_M$ to form a high quality factor (high-Q) bandpass filter.

In some implementations, a wideband receiver includes an integrated circuit pin that is configured to couple an RF signal to an RF signal path. The receiver also may include a frequency translated bandpass filter coupled to the RF signal path and configured to translate a baseband impedance to a higher frequency. The frequency translated bandpass filter includes multiple transconductance cells each having an effective transconductance of an increased magnitude for frequency components of the RF signal within a frequency band of interest and an effective transconductance of a reduced magnitude for frequency components of the RF signal outside the frequency band of interest.

The receiver also may include multiple frequency conversion cells configured to receive a multiple non-overlapping local oscillator (LO) signals. Each of the multiple frequency conversion cells may be further configured to mix one of the multiple RF current signals with the multiple non-overlapping LO signals. The receive also may include multiple baseband impedances coupled to the multiple frequency conversion cells and ground.

Each of the multiple transconductance cells is configured with a transconductance weighting that causes the effective transconductance of the transconductance system to be large when excited by RF signals arising from a harmonic within the frequency band of interest but zero for RF signals arising from harmonics outside the frequency band of interest. The transconductance weighting provides that only current excited by wanted harmonics are converted into a large voltage. The transconductance cells are configured to amplify an RF signal from any harmonic of a fundamental frequency. The transconductance cells can be further configured to amplify an RF signal from more than one harmonic multiple of the fundamental frequency.

Referring to FIG. 8, the frequency conversion cells 804$_1$-804$_M$ include metal-oxide semiconductor field effect transistors (MOSFETs) (not shown). Specifically, the frequency conversion cells 804$_1$-804$_M$ are n-channel MOSFETs (NMOS). However, the frequency conversion cells 804$_1$-804$_M$ can be implemented using any suitable frequency conversion device, including p-channel MOSFETs (PMOS), bipolar junction transistors (BJTs) and junction gate field effect transistors (JFETs). The MOSFETs provided in the frequency conversion cells 804$_1$-804$_M$ are operated substantially in their linear mode when powered ON.

According to some implementations, the high-Q FTBPF 800 is integrated in CMOS IC technology (or others, e.g., Bipolar, BiCMOS, and SiGe) and applied in wireless receiver systems including GSM, WCDMA, Bluetooth, and wireless LANs (e.g., IEEE 802.11).

Figure 9:
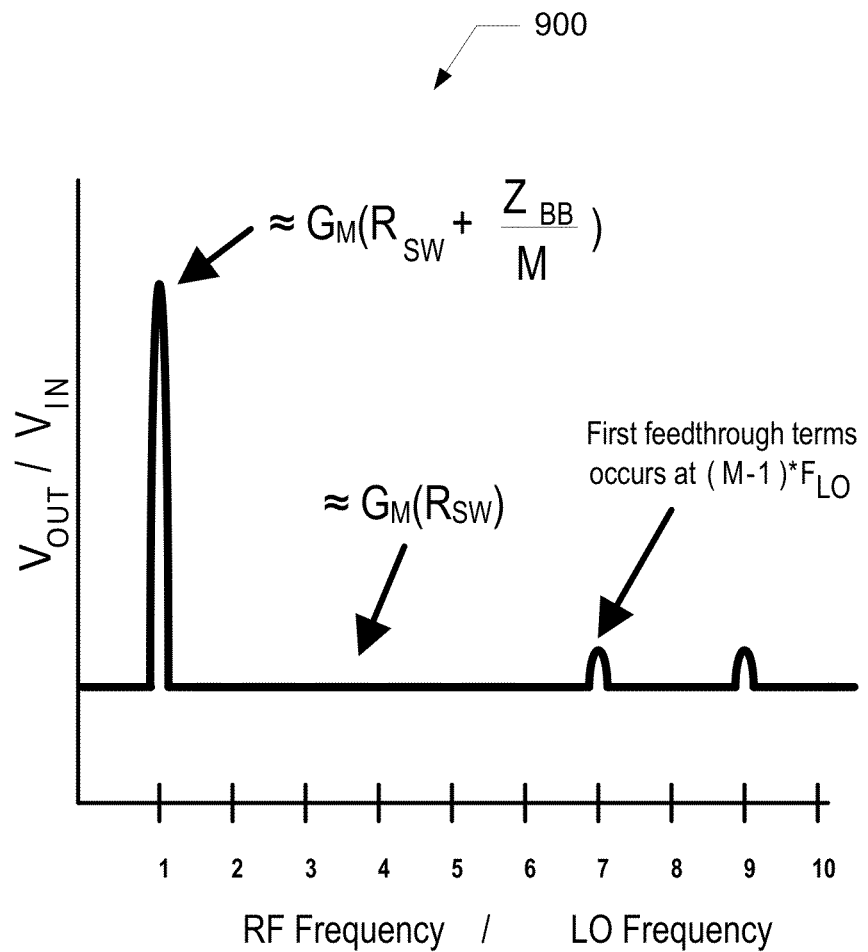
FIG. 9 illustrates a waveform diagram of a gain realized by the single-ended high-Q filter with enhanced harmonic rejection illustrated in FIG. 8 in accordance with one or more implementations.

FIG. 9 illustrates a waveform diagram 900 of a gain realized by the single-ended high-Q filter 800 with enhanced harmonic rejection illustrated in FIG. 8 in accordance with one or more implementations. The gain (e.g., $V_{OUT}/V_{IN}$) realized at the output of the high-Q FTBPF 800 can be equivalent to equation (4), shown above, where $G_M$ is the factor of proportionality between an input and output voltage, M represents the number of LO phases employed, $R_{SW}$ is the switch resistance of frequency conversion cells $804_1$-$804_M$, and $Z_{BB}$ is the impedance of the baseband impedances $806_1$-$806_M$.

Frequency conversion of an RF signal by the sum and difference in frequency up to the $(M-1)^{th}$ harmonic of the LO signals 310 (FIG. 3) and the RF signal is undesired and can create adverse effects, especially in wideband applications. By appropriately weighting the transconductance cells $802_1$-$802_M$, the transconductance weighting causes the RF current signals output from the transconductance cells $802_1$-$802_M$ to shift in phase. Thus, the RF current signals, before reaching the baseband impedances $806_1$-$806_M$, constructively sum to produce a resulting current signal that corresponds to down-converted signals from around the LO frequency (e.g., the wanted signal). In this regard, the phase-shifted current signals with opposing phases in effect cancel one another at the baseband impedance input. Therefore, no voltage gain can be realized for the canceled-out current signals (or unwanted signals). In some implementations, the input to the baseband impedances $806_1$-$806_M$ defines a pass-band around the wanted signal and minimal gain around the $7^{th}$ and $9^{th}$ LO harmonics. That is, the first feed-through terms may occur at $(M-1)^*\omega_{LO}$.

Given that there is no amplification of harmonic blockers at the output of the FTBPF with the enhanced harmonic rejection circuit, no harmonic blockers up to the $(M-1)^{th}$ harmonic can saturate the receiver.

FIG. 10 illustrates a conceptual diagram of a differential high-Q FTBPF 1000 with enhanced harmonic rejection in accordance with one or more implementations. The differential high-Q FTBPF 1000 processes a differential RF signal (e.g., $RF_{IN+}$ and $RF_{IN-}$) received at a differential input pair (e.g., node $V_{IN}$). The differential high-Q FTBPF 1000 includes passive mixers $1004_1$-$1004_M$ and baseband impedances $1006_1$-$1006_M$.

The differential high-Q FTBPF 1000 also employs multiple transconductance cells (e.g., $1002_1$-$1002_M$) to directly receive the inbound differential RF voltage signal (e.g., $V_{IN}$) for conversion to a differential current signal before mixing (or multiplying) the current signal with multiple phased LO signals (e.g., LO<M−1:0>). The high-Q FTBPF 1000 includes M transconductance cells $1002_1$-$1002_M$ configured to convert the input differential RF voltage signal at $V_{IN}$ into multiple RF current signals. In one or more implementations, each of the transconductance cells $1002_1$-$1002_M$ is configured with a transconductance gain relative to one another. That is, by appropriately weighting the transconductance cells $1002_1$-$1002_M$, the weighting causes the RF current signals to shift in phase. Thus, the RF current signals, before reaching the baseband impedances $1006_1$-$1006_M$, constructively sum to produce a resulting current signal that corresponds to downconverted signals from around the LO frequency (i.e. the wanted signal). In this regard, the phase-shifted current signals with opposing phases in effect cancel one another at the baseband impedance input.

According to some implementations, each of the transconductance cells $1002_1$-$1002_M$ has differential inputs, which produces a transconductance gain based on an output voltage given by:

$$V_{OUT} = \sum_{0}^{\frac{M}{2}-1} V_{OUT}\langle X \rangle \left( e^{\frac{j2\pi X}{M}} \right) \quad (9)$$

where j is an imaginary unit, X is an integer that represents one of the transconductance cells $1002_1$-$1002_M$ and its output, and M is the number of LO phases employed.

The baseband impedances $1006_1$-$1006_M$ may be capacitors that form a low-Q bandpass filter. The passive mixers $1004_1$-$1004_M$ are configured to translate the baseband impedances $1006_1$-$1006_M$ to a higher frequency. The translated baseband impedance ($Z_{IN}$) forms a high-Q bandpass filter that is presented at the differential input pair.

Figure 11:
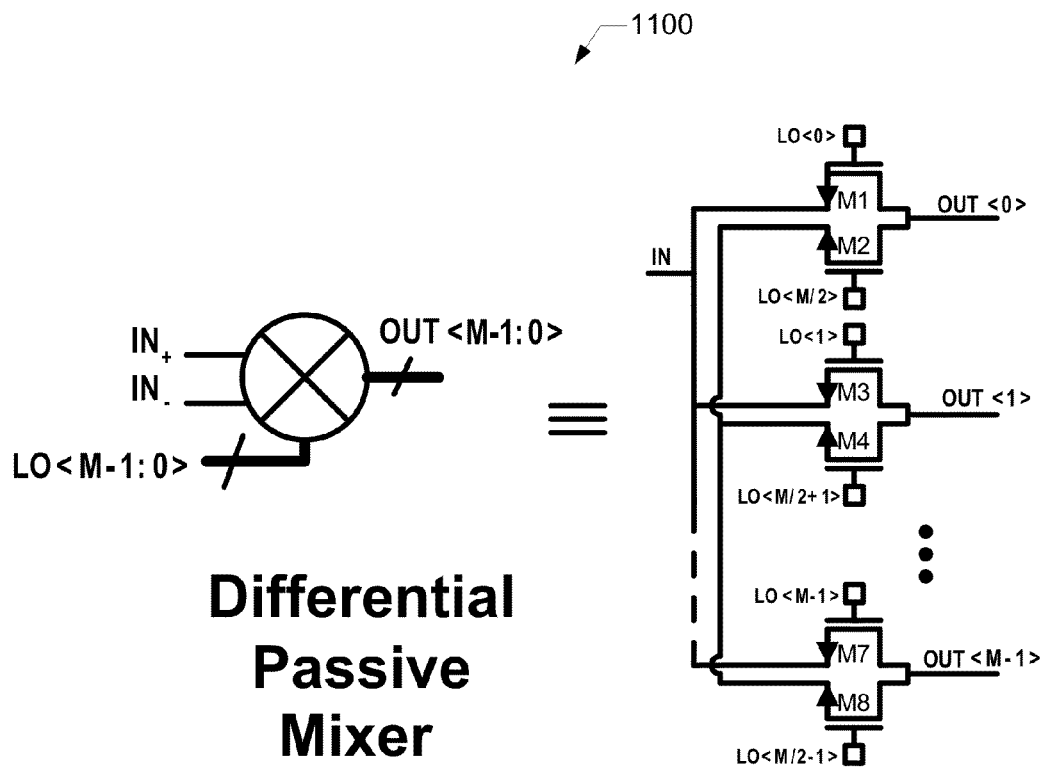
FIG. 11 illustrates a conceptual diagram of a differential passive mixer provided in the differential high-Q filter illustrated in FIG. 10 in accordance with one or more implementations.

FIG. 11 illustrates a conceptual diagram of a differential passive mixer 1100 provided in the differential high-Q filter 1000 illustrated in FIG. 10 in accordance with one or more implementations. According to some implementations, the differential passive mixer 1100 includes switching devices M1-M8, where M is equal to 8. The variable M can be defined as any positive integer. The switching devices M1-M8 are metal-oxide semiconductor field effect transistors (MOSFETs). Specifically, the switching devices M1-M8 are n-channel MOSFETs (NMOS). However, as will be appreciated by one of ordinary skill in the art, the switching devices M1-M8 can be implemented using any suitable switching device, including p-channel MOSFETs (PMOS), bipolar junction transistors (BJTs) and junction gate field effect transistors (JFETs). The switching devices M1-M8 may be operated substantially in their linear mode when ON.

In operation, the first switching device, M1, of the passive mixer 1008 receives a differential LO signal (LO<0>) at LO coupling 206 (FIG. 2). The LO signal has a frequency of $\omega_{LO}$ and a duty-cycle substantially equal to 12.5%. The gates of switching devices M1, M3 up to M−1 are coupled to the positive LO signal ($LO_+$), and the gates of switching devices M2, M4 up to $$\left( \frac{M}{2} - 1 \right)$$

are coupled to the negative LO signal (LO). Because the two LO signals ($LO_+$ and $LO_-$) are substantially 180-degrees out of phase, the switching device pair M1 and M2 are switched ON and OFF at non-overlapping intervals at the frequency of the LO signal ($\omega_{LO}$). The non-overlapping switching at a frequency of $\omega_{LO}$ effectively multiplies the positive RF signal ($RF_{IN+}$), coupled to the source of switching device M1, and the negative RF signal ($RF_{IN-}$), coupled to the source of switching device M2, by ±1. This effective multiplication results in frequency conversion of the differential RF signal by the sum ($\omega_{RF}+\omega_{LO}$) and difference ($\omega_{RF}-\omega_{LO}$ or $\omega_{LO}-\omega_{RF}$) in frequency between the LO signal (LO<0>) and the differential RF signal. The frequency-converted component of the RF signal is provided differentially to the baseband impedances $1006_1$-$1006_M$.

As noted above, the baseband impedances $1006_1$-$1006_M$ may include capacitors having impedances that are equivalent to equation (1), shown above, where j is the imaginary unit, ω is the frequency of the signal applied across the capacitor, and C is the capacitance.

The baseband impedance ($Z_{BB}$) presents an extremely large impedance for DC signals. However, as the frequency of the applied signal moves in either the positive or negative direction, away from DC (e.g., 0 MHz), the baseband impedance $Z_{BB}$ decreases. Thus, the capacitors effectively form a low-Q bandpass filter centered at baseband.

It follows that the frequency conversion of the differential RF signal by the passive mixers $1004_1$-$1004_M$ alters the baseband impedance seen by the differential RF signal at the differential input pair. Specifically, the impedance of the capacitors will each appear translated by $\pm\omega_{LO}$ as seen by the differential RF signal at the differential input pair, thus becoming a high-Q bandpass filter presented at the differential input pair.

It can be shown that the translated baseband impedance ($Z_{IN}$) is substantially given by:

$$Z_{IN}(j\omega_{RF}) = R_{SW} + \frac{4}{\pi^2} \frac{j\omega_{RF}}{C_{BB}\{(j\omega_{RF})^2 + \omega_{LO}^2\}} \quad (10)$$

where j is an imaginary unit, $\omega_{RF}$ is the frequency of the differential RF signal received at the differential input pair, $\omega_{LO}$ is the frequency of the LO signal received at LO coupling 206, $R_{SW}$ is the switch resistance of switching devices M1-M8, and $C_{BB}$ is the capacitance of the baseband impedances $1006_1$-$1006_M$.

One or more implementations are performed by one or more integrated circuits, such as application specific integrated circuits (ASICs) or field programmable gate arrays (FPGAs). In one or more implementations, such integrated circuits execute instructions that are stored on the circuit itself.

Those of skill in the art would appreciate that the various illustrative blocks, elements, components, and methods described herein may be implemented as electronic hardware. Various illustrative blocks, elements, components, and methods have been described above generally in terms of their functionality. Whether such functionality is implemented as hardware depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

As used in this specification and any claims of this application, the terms "receiver", "amplifier", "transconductance cell," and "mixer" all refer to electronic or other technological devices. These terms exclude people or groups of people.

The predicate words "configured to" and "operable to" do not imply any particular tangible or intangible modification of a subject, but, rather, are intended to be used interchangeably. In one or more implementations, a receiver configured to receive and process an operation or a component may also mean the receiver being operable to receive and process the operation.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "implementation" does not imply that such implementation is essential to the subject technology or that such implementation applies to all configurations of the subject technology. A disclosure relating to an implementation may apply to all implementations, or one or more implementations. An implementation may provide one or more examples of the disclosure. A phrase such an "implementation" may refer to one or more implementations and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

Any implementation described herein as an "example" is not necessarily to be construed as preferred or advantageous over other implementations. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A frequency translated filter, comprising:
a plurality of transconductance cells configured to convert a received radio frequency (RF) voltage signal into a respective plurality of RF current signals, wherein each of the plurality of transconductance cells provides an effective transconductance of a first magnitude for frequency components of the received RF voltage signal arising from a first harmonic and an effective transconductance of a second magnitude less than the first magnitude for frequency components of the received RF voltage signal arising from harmonics at integer multiples of the first harmonic;
a plurality of frequency conversion cells coupled to the plurality of transconductance cells and configured to mix respective ones of the plurality of RF current signals with a plurality of non-overlapping local oscillator (LO) signals; and
a plurality of baseband impedances coupled between outputs of the plurality of frequency conversion cells and ground, wherein the plurality of baseband impedances are frequency translated by mixed signals from the plurality of frequency conversion cells.

2. The frequency translated filter of claim 1, wherein the plurality of transconductance cells and the plurality of frequency conversion cells employ single-ended inputs.

3. The frequency translated filter of claim 2, wherein each of the plurality of transconductance cells is configured with a transconductance weighting equivalent to $$k\left[1+\cos\left(\frac{2\pi X}{M}\right)\right],$$

where X is an integer representing one of the plurality of transconductance cells, M is a number of LO signals employed, and k is an arbitrary constant that determines the effective transconductance of the transconductance cell.

4. The frequency translated filter of claim 1, wherein the plurality of transconductance cells and the plurality of frequency conversion cells employ differential inputs.

5. The frequency translated filter of claim 4, wherein each of the plurality of transconductance cells is configured with a transconductance weighting equivalent to $$k\left[\cos\left(\frac{2\pi X}{M}\right)\right],$$

where X is an integer representing one of the plurality of transconductance cells, M is a number of LO phases employed, and k is an arbitrary constant that determines the effective transconductance of the transconductance cell.

6. The frequency translated filter of claim 1, wherein the plurality of non-overlapping LO signals have successive phase shifts substantially equal to 360/M degrees, where M is a number of the plurality of non-overlapping LO signals.

7. The frequency translated filter of claim 1, wherein the plurality of non-overlapping LO signals each correspond to a fundamental frequency.

8. The frequency translated filter of claim 7, wherein the plurality of transconductance cells each receive an input impedance equivalent to the plurality of baseband impedances translated in frequency by the fundamental frequency.

9. The frequency translated filter of claim 1, wherein the plurality of non-overlapping LO signals have identical magnitudes and are phase-shifted from one another.

10. The frequency translated filter of claim 1, wherein each of the plurality of transconductance cells produces a transconductance gain according to an output voltage equivalent to $$V_{OUT} = \sum_{0}^{M-1} V_{OUT}\langle X\rangle\left(e^{\frac{j2\pi X}{M}}\right),$$

where j is an imaginary unit, where X is an integer representing one of the plurality of transconductance cells, and M is a number of the plurality of non-overlapping LO signals.

11. The frequency translated filter of claim 1, wherein each of the plurality of transconductance cells is configured with a transconductance weighting that causes the effective transconductance of the frequency-translated filter to be non-zero when excited by a received RF voltage signal arising from a harmonic within a frequency band of interest but zero for a received RF voltage signal arising from harmonics outside the frequency band of interest.

12. The frequency translated filter of claim 1, wherein each of the plurality of baseband impedances includes a capacitor.

13. A radio frequency (RF) receiver comprising:
a plurality of transconductance cells configured to configured to convert a received RF signal into a plurality of RF current signals proportional to a voltage corresponding to the received RF signal, wherein each of the plurality of transconductance cells has an effective transconductance of a first magnitude for frequency components of the received RF signal arising from a first harmonic and an effective transconductance of a second magnitude less than the first magnitude for frequency components of the received RF signal arising from harmonics at integer multiples of the first harmonic; and
a frequency translated bandpass filter coupled to the plurality of transconductance cells and configured to produce a filtered inbound RF signal.

14. The RF receiver of claim 13, wherein the frequency translated bandpass filter comprises:
a plurality of frequency conversion cells coupled to the plurality of transconductance cells and configured to mix respective ones of the plurality of RF current signals with a plurality of non-overlapping local oscillator (LO) signals to produce respective mixed signals; and
a plurality of baseband impedances coupled to the plurality of frequency conversion cells and ground and configured to provide a high quality factor filter when frequency translated by the mixed signals.

15. The RF receiver of claim 13, wherein each of the plurality of transconductance cells is configured with a transconductance weighting that causes the effective transconductance of the transconductance cell to increase up to the first magnitude when excited by the frequency components arising from the first harmonic and to decrease to the second magnitude for the frequency components arising from harmonics other than the first harmonic.

16. The RF receiver of claim 15, wherein the transconductance weighting provides that wanted harmonics cause a current change through the transconductance cell.

17. The RF receiver of claim 13, wherein the plurality of transconductance cells are configured to amplify frequency components of the RF signal arising from harmonics of a fundamental frequency.

18. The RF receiver of claim 17, wherein the plurality of transconductance cells are further configured to amplify frequency components of the RF signal arising from more than one harmonic multiple of the fundamental frequency.

19. The RF receiver of claim 13, wherein the frequency translated bandpass filter employs differential inputs.

20. The RF receiver of claim 19, wherein each of the plurality of transconductance cells produces a transconductance gain according to an output voltage equivalent to $$V_{OUT} = \sum_{0}^{\frac{M}{2}-1} V_{OUT}\langle X \rangle \left( e^{\frac{j2\pi X}{M}} \right),$$

where j is an imaginary unit, X is an integer representing one of the plurality of transconductance cells, and M is a number of LO signals employed.

\* \* \* \* \*